United States Patent
Lim et al.

(10) Patent No.: US 6,406,975 B1
(45) Date of Patent: Jun. 18, 2002

(54) METHOD FOR FABRICATING AN AIR GAP SHALLOW TRENCH ISOLATION (STI) STRUCTURE

(75) Inventors: Victor Seng Keong Lim; Young-Way Teh; Ting-Cheong Ang; Alex See, all of Singapore (SG); Yong Kong Siew, Sungai Pelek (MY)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/721,718

(22) Filed: Nov. 27, 2000

(51) Int. Cl.[7] .................. H01L 21/76; H01L 21/44; H01L 21/4763
(52) U.S. Cl. .................. 438/421; 438/431; 438/432; 438/598; 438/619
(58) Field of Search .................. 438/421, 432, 438/431, FOR 227, 619, 411, 598, 637, 667, 669

(56) References Cited

U.S. PATENT DOCUMENTS

| | | | | |
|---|---|---|---|---|
| 4,994,404 A | * | 2/1991 | Sheng et al. | 437/44 |
| 5,098,856 A | | 3/1992 | Beyer et al. | 437/65 |
| 5,387,538 A | | 2/1995 | Moslehi | 437/67 |
| 5,508,234 A | | 4/1996 | Dusablon, Sr. et al. | 437/228 |
| 5,559,367 A | * | 9/1996 | Cohen et al. | 257/77 |
| 5,830,332 A | * | 11/1998 | Babich et al. | 204/92.15 |
| 5,953,626 A | | 9/1999 | Hause et al. | 438/622 |
| 6,001,705 A | | 12/1999 | Zombrano | 438/421 |
| 6,004,863 A | * | 12/1999 | Jang | 438/427 |
| 6,004,864 A | * | 12/1999 | Haung et al. | 438/433 |
| 6,071,805 A | | 6/2000 | Liu | 438/619 |
| 6,127,241 A | * | 10/2000 | Rha | 438/437 |
| 6,130,102 A | * | 10/2000 | White, Jr. et al. | 438/240 |

* cited by examiner

Primary Examiner—Michael Lebentritt
(74) Attorney, Agent, or Firm—George O. Saile; Rosemary L.S. Pike; William J. Stoffel

(57) ABSTRACT

A method of manufacturing a shallow trench isolation (STI) with an air gap that is formed by decomposing an organic filler material through a cap layer. A pad layer and a barrier layer are formed over the substrate. The pad layer and the barrier layer are patterned to form a trench opening. We form a trench in substrate by etching through the trench opening. A first liner layer is formed on the sidewalls of the trench. A second liner layer over the barrier layer and the first liner layer. A filler material is formed on the second liner layer to fill the trench. In an important step, a cap layer is deposited over the filler material and the second liner layer. The filler material is subjected to a plasma and heated to vaporize the filler material so that the filler material diffuses through the cap layer to form a gap. An insulating layer is deposited over the cap layer. The insulating layer is planarized. The barrier layer is removed.

18 Claims, 4 Drawing Sheets

METHOD FOR FABRICATING AN AIR GAP SHALLOW TRENCH ISOLATION (STI) STRUCTURE

BACKGROUND OF INVENTION

1) Field of the Invention

This invention relates generally to fabrication of semiconductor devices and more particularly to the fabrication of a shallow trench isolation (STI) structure and most particularly to a shallow trench isolation (STI) structure with an air gap.

2) Description of the Prior Art

Shallow trench isolation (STI) are commonly used in the fabrication of semiconductor devices to isolate active regions of the semiconductor substrate. Usually, the isolating trench is filled with a dielectric material. Polysilicon, chemically vapor deposited (CVD) silicon dioxide, BSG glass, and polyimides are examples of prior art trench-fill materials. Each of these materials have a dielectric constant which is considerably larger than that of air.

Present conventional shallow trench isolation (STI) structure use high density plasma chemical vapor deposition (HDPCVD) oxides as the filler material. As the K value of the silicon oxide is about 4.0, channel stop implants are usually required to raise the field inversion voltage. As will be appreciated by those skilled in the art, an air-filled trench would be advantageous in that it would minimize the parasitic coupling between devices isolated by the trench and reduce electrical leakage and mechanical stress as compared with trench-fill materials of the type described above. Proposals have been made in the prior art for an air-filled isolation trench.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,071,805 (Liu) shows an air gap between lines. The air gap formed by decomposing an organic material filler. U.S. Pat. No. 5,387,538 (Moslehi) shows an air gap lateral to a STI. U.S. Pat. No. 5,953,626 (Hause et al.) shows an air gap for conductive lines. U.S. Pat. No. 6,001,705 (Zombrano) and U.S. Pat. No. 5,508,234 (Dusablon, Sr. et al.) shows STI processes with air gaps. U.S. Pat. No. 5,098,856 (Beyer) shows a process to form air gaps in STI by removing a sacrificial layer.

However, further improvement in air gap STI structures are needed.

SUMMARY OF THE INVENTION

It is an object of the present invention to provide a method for fabricating a shallow trench isolation (STI) structure.

It is an object of the present invention to provide a method for fabricating a shallow trench isolation (STI) structure having an air gap.

It is an object of the present invention to provide a method for fabricating a shallow trench isolation (STI) structure having an air gap formed by vaporizing a filler material through a permeable cap layer.

It is an object of the present invention to provide a method for fabricating a shallow trench isolation (STI) structure having an air gap formed by vaporizing a filler material through a permeable cap layer using an insitu process.

To accomplish the above objectives, the present invention provides a method of manufacturing a shallow trench isolation (STI) with an air gap which is characterized as follows. A pad layer and a barrier layer are formed over the substrate. The pad layer and the barrier layer are patterned to form a trench opening. We form a trench in substrate by etching through the trench opening. A first liner layer is formed on the sidewalls of the trench. A second liner layer over the barrier layer and the first liner layer. A filler material is formed on the second liner layer to fill the trench. In an important step, a cap layer is deposited over the filler material and the second liner layer. The filler material is heated to vaporize the filler material so that the filler material diffuses through the cap layer to form a gap. An insulating layer is deposited over the cap layer. The insulating layer is planarized. The barrier layer is removed.

Key elements of the present invention are the cap layer that the filler layer diffuses through to create the air gap. The filler material is covered by the cap layer and is not exposed to the atmosphere. This is a critical difference compared to the prior arts. Also, the filler material is vaporized/decomposed by a HDPCVD plasma process at an elevated temperature. Preferably the filler material is polybutadine (PB).

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings.

A preferred embodiment of the invention for a method of fabrication of a STI structure having an air gap can comprising following the steps.

Figure 1:
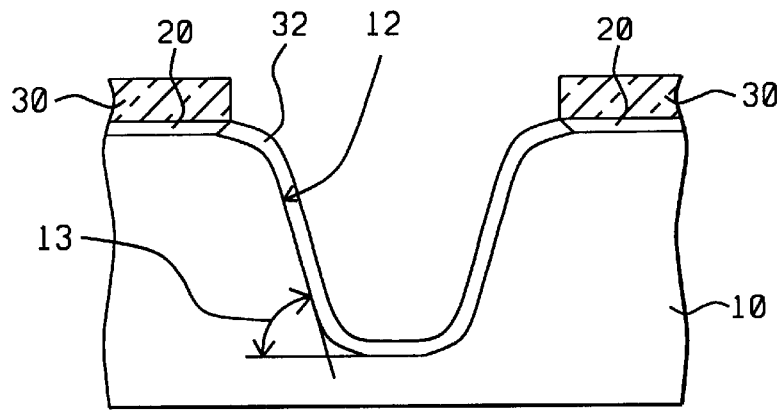
FIGS. 1 through 9 are cross sectional views for illustrating a method for forming a STI structure with an air gap according to a preferred embodiment of the present invention.

As shown in FIG. 1, a pad layer 20 is formed over a substrate. A barrier layer 30 is formed over the pad oxide layer. The pad layer is comprised of oxide and has a thickness of between about 50 and 500 Å. The barrier layer 30 is comprised of nitride and has a thickness of between about 1000 and 3000 Å.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication.

Next, the pad layer 20 and the barrier layer are patterned to form a trench opening. The patterning can be performed by a conventional photo process.

Still referring to FIG. 1 we form a trench 12 in substrate 10 by etching through the trench opening. The trench 12 has sidewalls. The trench preferably has a depth between 0.18 and 0.5 $\mu$m with a trench angle 13 between 70 and 85°.

Subsequently, we form a first liner layer 32 on the sidewalls of the trench 12. The first liner layer is preferably comprised of oxide and has a thickness of between about 100 and 500 Å.

Figure 2:
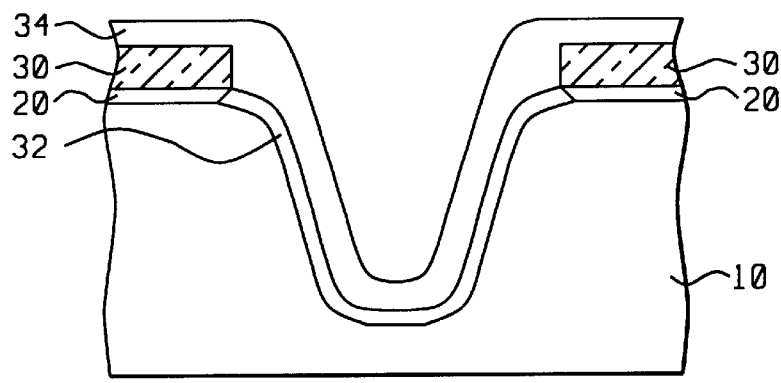
Figure 3:
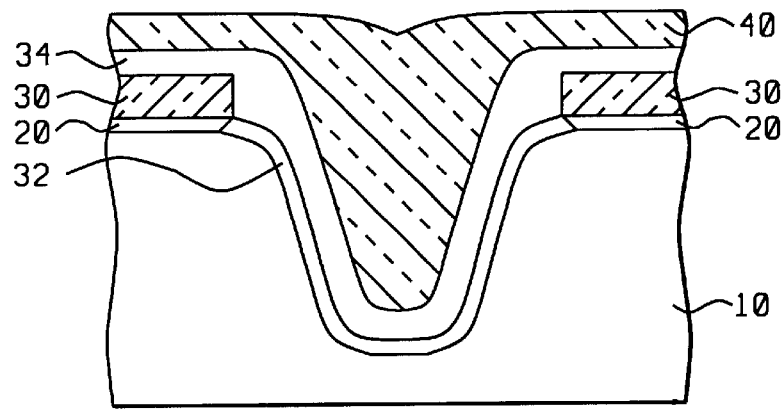

As shown in FIG. 2, we form a second liner layer 34 over the barrier layer 30 and the first liner layer 32. The second liner layer 34 is preferably comprised of oxide and has a thickness of between about 200 and 2000 Å.

Filler Material 40

In an important step, we form a filler material 40 on the second liner layer 34 to fill the trench 12.

The filler material 40 is preferably comprised flourinated amorphous carbon (a-F—C) or silica gel or silaxane, polybutadine (PB). PB can be purchased from Sigma Aldrich. The filler material can be any material that has the property of being thermally unstable and etches selectively. The filler material 40 can vaporize (e.g., go into a gas state or decompose (break down into smaller molecules)) at a temperature lower than the second liner layer 34. Vaporize means changing into a gas phase and may include chemical changes. The filler material 40 is preferably comprised of a thermally unstable organic polymer that vaporized at a temperature between 350 and 1000° C. and more preferably between 350 and 500° C.

The filler material 40 is most preferably comprised of polybutadine (PB) and the filler material is spun on to fill the trench 12. The inventors have found the filler material of PB has advantages over all other organic fillers because compatible with other processes.

Figure 10:
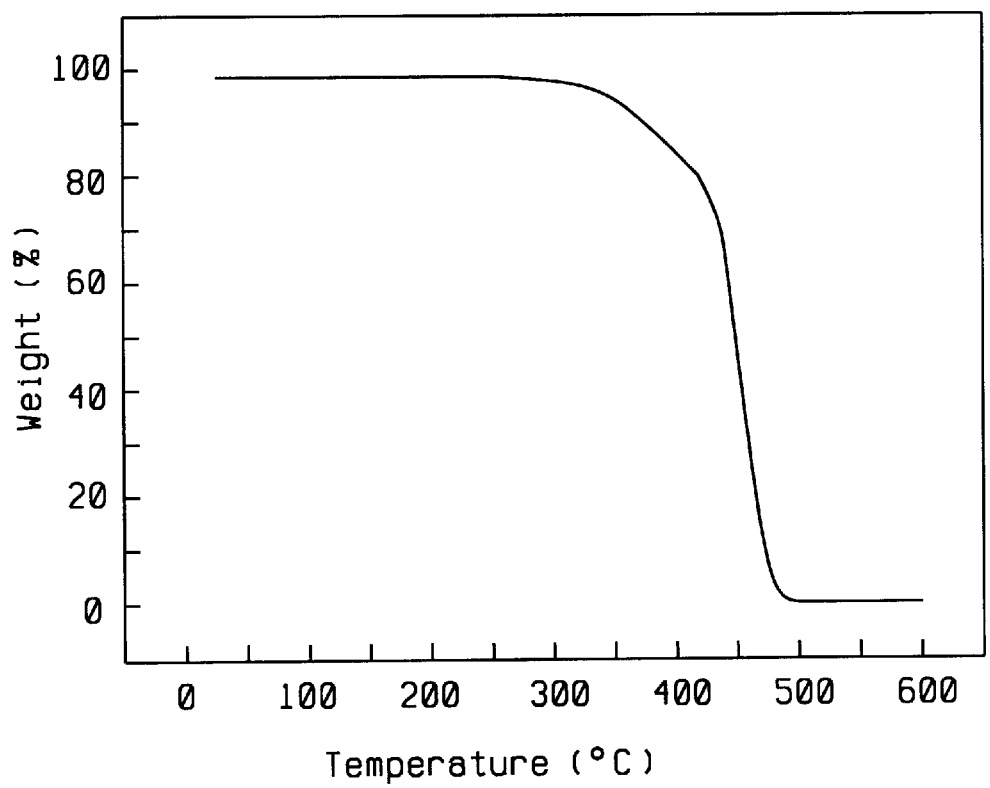
FIG. 10 is a graph illustration the decomposition temperature of polybutadine (PB) as a function of Wt %.

FIG. 10 shows a plot of the decomposition (e.g., vaporization—liquid or solid to gas phase) temperature of PB as a weight percent of PB in solvent as a function of temperature. A main point of FIG. 10 is that PB (100%) can decompose completely (100%) within a certain temperature range.

Figure 4:
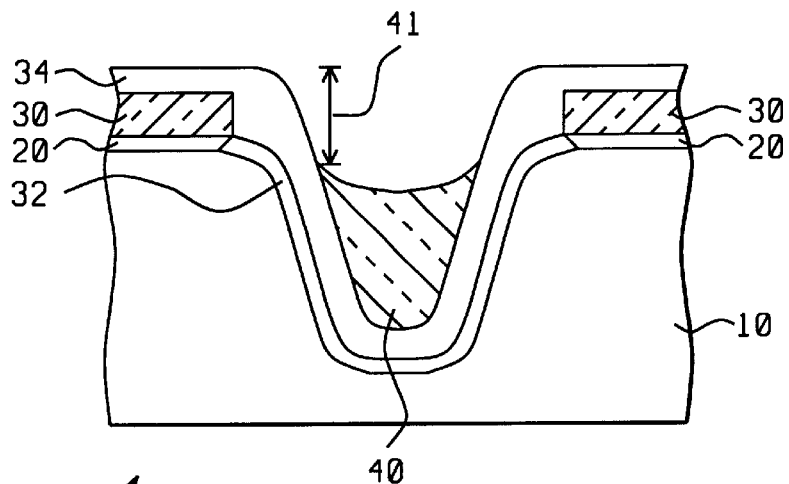

Next, as shown in FIG. 4, we preferably etch back the filler material 40. The etch back can be performed using a oxygen plasma.

After the etch back, the filler material 40 has a thickness of between about 0.2 and 0.4 $\mu$m. The filler material is etched back a distance 41 below the surface of the second liner layer between 500 and 3000 Å. Preferably the etch back step removes all the filler 40 from over the Active areas (e.g., the substrate outside the trench 12).

Insitu Steps

Figure 5:
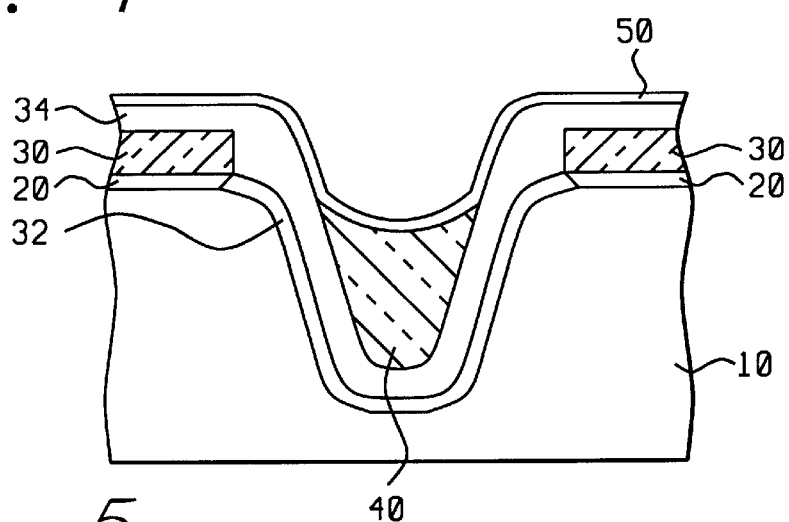
Figure 6:
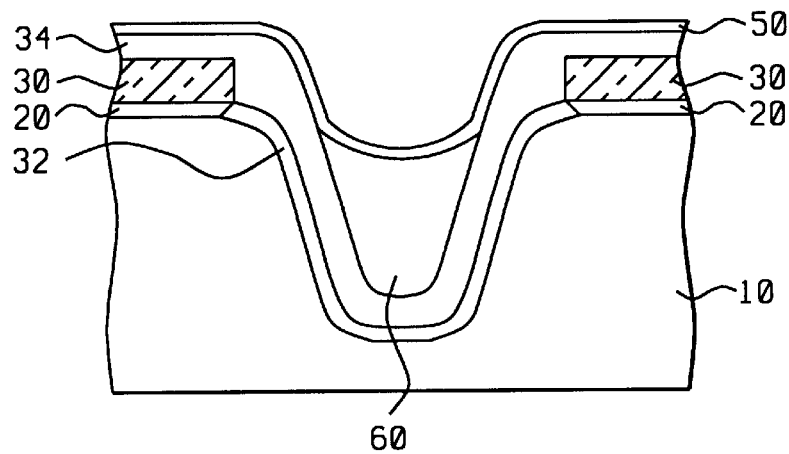
Figure 7:
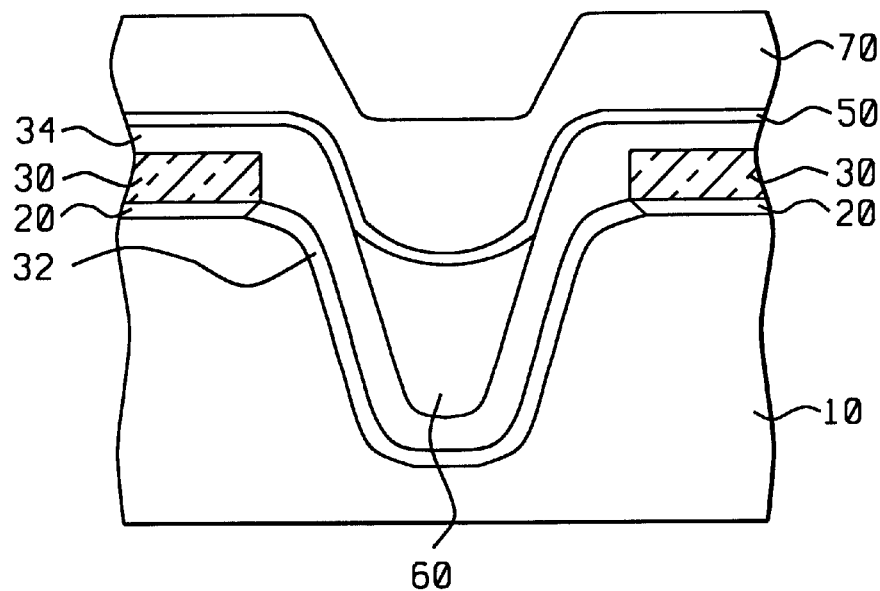

The steps shown in FIGS. 5, 6, and 7 are preferably performed in situ in a HDPCVD or a plasma enhanced chemical vapor deposition (PECVD) tool. The invention reduces the gapfill requirement by reducing the aspect ratio so that a PECVD tool can be used. (The steps are (1) deposit a cap layer 50, (2) vaporize filler layer (3) deposit insulating layer 70.) That means that the wafer remains in the same chamber without breaking vacuum. A HDPCVD tool is a tool capable of high density plasma sources supply low-energy ions with densities greater than 1E12 cm$^{-2}$. For example, the step in FIGS. 5, 6 and 7 can be performed a HDPCVD tool model Centura HDP by Applied Materials or a Speed II Sequel by Nvellus or PECVD tools (e.g., P5000 from AMAT.

Deposit Cap Layer 50

As shown in FIG. 5, we deposit a cap layer 50 over the filler material and the second liner layer 34. The cap layer is comprised of oxide, SiN or Silicon oxynitride (SiON) and most preferably HDPCVD oxide.

The cap layer (HDPCVD oxide) is deposited using a PECVD or high density plasma chemical vapor deposition (HDPCVD) process and uses a Si-containing gas (e.g., SiH$_4$), O$_2$ (or TEOS) N$_2$O and NO gas and Ar gas and is performed at a temperature between 325 and 375° C. and at a source plasma power between 3KW and 3.5 KW and a plasma density between 1E11 and 1E11 and chuck temperature between 300 and 350° C. PECVD the preferred parameters are Temp between 300 and 400° C. and RF power between 25 and 300 W.

It is critical that the inorganic dielectric cap layer 50 is permeable to the vapor of the subsequently formed filler material 40 (e.g., PB). This is accomplished by having the oxide cap layer thin(e.g., a thickness of between about 20 and 1000 Å).

Vaporization of the Filler Material

As shown in FIG. 6 we decompose and vaporize the filler material to vaporize the filler material so that the filler material 40 diffuses through the cap layer 50 to form a gap 60.

When we decompose the filler material, the organic material breaks down into small C containing molecules in the vapor phase, that allows the molecules to diffuse thru the cap layer.

The filler material 40 can be vaporization using O$_2$ plasma & heat or using only heat (no plasma).

The vaporization is performed by a plasma process at a relatively elevated temperature compared to the cap layer deposition temperature. The filler material is preferably subjected to a HPDCVD plasma containing O$_2$ and Ar and at a temperature between 460 and 480° C. The filler material comprised of PB is preferably heated to a temperature between 460 and 480° C. It is critical that an O$_2$ plasma at a temperature a temperature between 460 and 480° C. is used to vaporize the PB filler. The plasma serves to heat the gas in the chamber, but the plasma is not required.

Turn Off SiH$_4$ and Chuck Cooling Water Flow

The preferred vaporization process is the same as the cap deposition step, except that the SiH$_4$ gas is turned off and the chuck cooling is turned off. q is this correct→? The chuck cooling is a He cooling loop thru the wafer chuck (Active cooling).

Insulating Layer 70

As shown in FIG. 7, we deposit an insulating layer 70 over the cap layer 50.

The insulating layer 70 is preferably comprised of oxide deposited by a high density plasma chemical vapor deposition (HDPCVD) process by turning back on the $SiH_4$ and the chuck He cooling from the previous vaporization step.

High density plasma (HDP) oxide deposition is defined as chemical vapor deposition with simultaneous dc-bias sputtering using a mixture of silicon-containing, oxygen containing and non-reactive gasses (e.g., noble gasses). High density plasma sources supply low-energy ions with densities greater than 1E12 $cm^{-2}$. In HDP oxide deposition, bias sputtering is achieved by a rf bias separately applied to the substrate to avoid charge accumulation. During deposition, the substrate is self-biased to a dc voltage that serves to accelerate Ar ions for Bias sputtering and controlling the film properties, deposition rates, etc. This method generally forms a high quality oxide with good thermal stability, low moisture uptake and fine mechanical properties. It is recognized that HDP-$SiO_2$ deposition techniques employs simultaneous deposition and dc-bias sputtering to enhance gap-filing.

After this, the wafer is preferably removed from the HDPCVD chamber or PECVD chamber.

Figure 8:
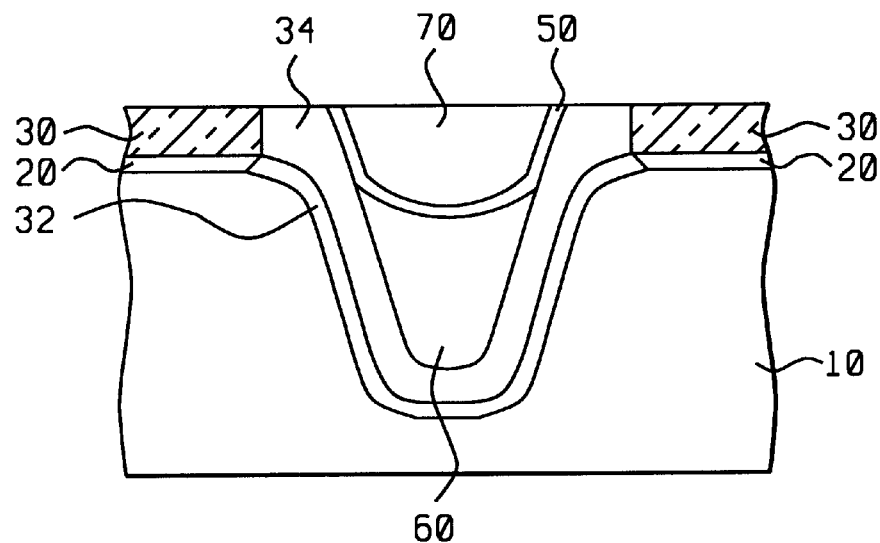
Figure 9:
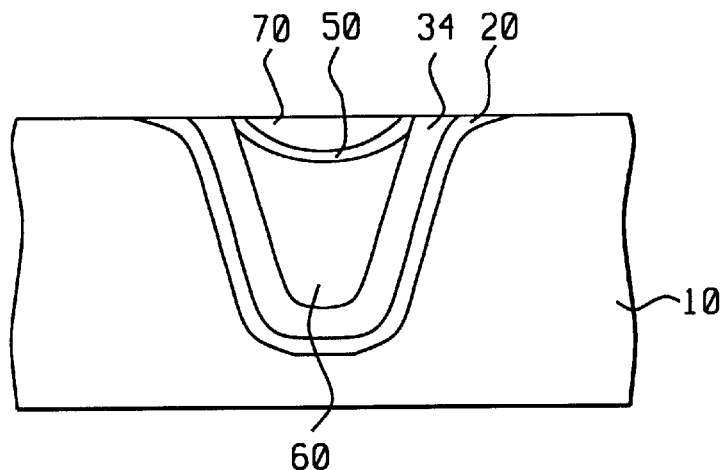

As shown in FIG. 8, the insulating layer 70 is planarized. Preferably the insulating layer 70 is planarized using a chemical-mechanical polish (CMP) process using the barrier layer as a chemical-mechanical polish (CMP) stop.

The barrier layer 30 is removed preferably by a selective etch (e.g., Hot phosphoric acid). Also, an oxide dip etch can be performed to etch back the exposed dielectric layers (e.g., pad layer 20, the exposed first and second liners layers 20 34, the cap layer 50 and the insulating layer 70).

Advantages of the Prior Art

The invention has a critical cap layer 50 (see FIG. 5) that covers the filler material 40 during the vaporization of the filler material.

In contrast, U.S. Pat. No. 6,071,805 (Liu) and U.S. Pat. No. 5,098,856 and other U.S. patents do not form a cap layer over a filler material. The invention's cap layer gives a better air gap because it prevents the overlying dielectric layer 70 from filling in the air gap 60. The invention's process is more repeatable and reproducible.

Advantages of the Invention

Key elements of the present invention are the cap layer 50 that the filler layer 40 diffuses through to create the air gap 60. The filler material 40 is covered by the cap layer 50 and is not exposed to the atmosphere. This is a critical difference compared to the prior arts. Also, the filler material is vaporized/decomposed by a HDPCVD plasma process at an elevated temperature.

Also, the invention's three steps are performed insitu: (1) deposit a cap layer 50, (2) vaporize filler layer (3) deposit insulating layer 70.) That means that the wafer remains in the same chamber without breaking vacuum.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a STI structure having an air gap; comprising the steps of:
    a) forming a pad layer and a barrier layer over said substrate;
    b) patterning said pad layer and said barrier layer to form an trench opening;
    c) forming a trench in substrate by etching through said trench opening; said trench having sidewalls;
    d) forming a liner layer on said sidewalls of said trench;
    e) forming a filler material on said liner layer to fill said trench; said filler material can vaporize at a temperature lower than said liner layer; said filler layer is comprised of a thermally unstable polymer;
    f) etching back said filler material using a oxygen plasma;
    g) depositing a cap layer over said filler material and said liner layer;
    h) heating said filler material to vaporize said filler material so that said filler material diffuses through said cap layer to form a gap; and
    i) depositing an insulating layer over said cap layer.

2. The method of claim 1 wherein steps (g) through (i) are performed in situ in a HDPCVD chamber.

3. The method of claim 1 which further includes: planarizing said insulating layer using said barrier layer as a chemical-mechanical polish (CMP) stop; and removing the barrier layer.

4. The method of claim 1 wherein said pad layer is comprised of oxide and has a thickness of between about 20 and 200 Å.

5. The method of claim 1 wherein said barrier layer is comprised of nitride and has a thickness of between about 1000 and 2000 Å.

6. The method of claim 1 wherein said trench has a depth between 0.18 and 0.4 $\mu$m.

7. The method of claim 1 wherein said liner layer is comprised of a first and a second liner layer; said first liner layer is comprised of oxide and has a thickness of between about 100 and 500 Å.

8. The method of claim 1 wherein said filler material is comprised of polybutadine (PB) and said filler material is spun on to fill said trench.

9. The method of claim 1 wherein said filler material is comprised of a thermally unstable polymer that vaporized at a temperature between 300 and 500° C.

10. The method of claim 1 wherein said filler material has a thickness of between about 0.2 $\mu$m and 0.4 $\mu$m.

11. The method of claim 1 wherein said filler material is etched back a distance below the surface of said second liner layer between 100 and 1000 Å.

12. The method of claim 1 wherein said cap layer is deposited using a high density plasma chemical vapor deposition (HDPCVD) process and uses a Si-containing gas and is performed at a temperature between 325 and 375° C.

13. The method of claim 1 wherein said filler material is heated to a temperature between 460 and 480° C.

14. The method of claim 1 wherein said insulating layer is comprised of oxide deposited by a high density plasma chemical vapor deposition (HDPCVD) process.

15. A method of fabrication of a STI structure having an air gap; comprising the steps of:
 a) forming a pad layer and a barrier layer over said substrate;
  (1) said pad layer is comprised of oxide and has a thickness of between about 50 and 500 Å;
  (2) said barrier layer is comprised of nitride and has a thickness of between about 1000 and 3000 Å;
 b) patterning said pad layer and said barrier layer to form an trench opening;
 c) forming a trench in substrate by etching through said trench opening; said trench having sidewalls;
  (1) said trench has a depth between 0.18 and 0.5 μm and a trench angle between 70 and 85°;
 d) forming a first liner layer on said sidewalls of said trench;
  (1) said first liner layer is comprised of oxide and has a thickness of between about 100 and 500 Å;
 e) forming a second liner layer over said barrier layer and said first liner layer;
  (1) said second liner layer is comprised of oxide and has a thickness of between about 200 and 2000 Å;
 f) forming a filler material on said second liner layer to fill said trench; said filler material can vaporize at a temperature lower than said second liner layer;
  (1) said filler material is comprised of polybutadine (PB) and said filler material is spun on to fill said trench;
  (2) said filler material is comprised of a thermally unstable polymer that vaporized at a temperature between 350 and 500° C.;
 g) etching back said filler material using a oxygen plasma;
  (1) said filler material has a thickness of between about 2000 and 4000 Å;
  (2) said filler material is etch back a distance below the surface of said second liner layer between 500 and 3000 Å;
 h) placing said substrate in a HDPCVD chamber;
 i) depositing a cap layer comprised of oxide over said filler material and said second liner layer;
  (1) said cap layer is deposited using a high density plasma chemical vapor deposition (HDPCVD) process and uses a Si-containing gas and is performed at a temperature between 325 and 375° C.;
 j) heating said filler material to vaporize said filler material so that said filler material diffuses through said cap layer to form a gap;
  (1) said filler material is heated to a temperature between 460 and 480° C.;
 k) depositing an insulating layer over said cap layer;
  (1) said insulating layer is comprised of oxide deposited by a high density plasma chemical vapor deposition process;
 l) removing said substrate from said HDPCVD chamber;
 m) planarizing said insulating layer using said barrier layer as a chemical-mechanical polish stop; and
 n) removing the barrier layer.

16. The method of claim 1 wherein said filler material is comprised of a material selected from the group consisting of silica gel or silaxane, and polybutadine (PB).

17. A method of fabrication of a STI structure having an air gap; comprising the steps of:
 a) forming a pad layer and a barrier layer over said substrate;
 b) patterning said pad layer and said barrier layer to form an trench opening;
 c) forming a trench in substrate by etching through said trench opening; said trench having sidewalls;
 d) forming a liner layer on said sidewalls of said trench; said liner layer comprised of oxide;
 e) forming a filler material on said second liner layer to fill said trench; said filler material can vaporize at a temperature lower than said second liner layer;
  (1) said filler material is comprised of polybutadine (PB) and said filler material is spun on to fill said trench;
  (2) said filler material is comprised of a thermally unstable polymer that vaporized at a temperature between 350 and 500° C.;
 f) etching back said filler material using a oxygen plasma;
  (1) said filler material has a thickness of between about 2000 and 4000 Å;
  (2) said filler material is etch back a distance below the surface of said liner layer between 500 and 3000 Å;
 g) placing said substrate in a HDPCVD chamber;
 h) depositing a cap layer over said filler material and said second liner layer; said cap layer comprised of an oxide;
  (1) said cap layer is deposited using a high density plasma chemical vapor deposition (HDPCVD) process and uses a Si-containing gas and is performed at a temperature between 325 and 375° C.;
 i) heating said filler material to vaporize said filler material so that said filler material diffuses through said cap layer to form a gap;
  (1) said filler material is heated to a temperature between 460 and 480° C.;
 j) depositing an insulating layer over said cap layer;
 k) removing said substrate from said HDPCVD chamber;
 l) planarizing said insulating layer using said barrier layer as a chemical-mechanical polish stop; and
 m) removing the barrier layer.

18. The method of claim 17 wherein said liner layer is comprised of a first liner layer and a second liner layer; said first liner layer is on said sidewalls of said trench; said second liner layer is on said first liner layer;
 first liner layer is comprised of oxide and has a thickness of between about 100 and 500 Å;
 said second liner layer is comprised of oxide and has a thickness of between about 200 and 2000 Å.

* * * * *